(12) United States Patent
Maeda et al.

(10) Patent No.: US 8,304,920 B2
(45) Date of Patent: Nov. 6, 2012

(54) ENERGY RAY-CURABLE POLYMER, AN ENERGY RAY-CURABLE ADHESIVE COMPOSITION, AN ADHESIVE SHEET AND A PROCESSING METHOD OF A SEMICONDUCTOR WAFER

(75) Inventors: Jun Maeda, Munich (DE); Keiko Tanaka, Tatebayashi (JP)

(73) Assignee: LINTEC Corporation, Tokyo (JP)

( * ) Notice: Subject to any disclaimer, the term of this patent is extended or adjusted under 35 U.S.C. 154(b) by 0 days.

(21) Appl. No.: 12/935,677

(22) PCT Filed: Mar. 12, 2009

(86) PCT No.: PCT/JP2009/054742
§ 371 (c)(1),
(2), (4) Date: Dec. 6, 2010

(87) PCT Pub. No.: WO2009/122878
PCT Pub. Date: Oct. 8, 2009

(65) Prior Publication Data
US 2011/0104874 A1    May 5, 2011

(30) Foreign Application Priority Data

Mar. 31, 2008 (JP) ................................ 2008-093897

(51) Int. Cl.
*H01L 23/48* (2006.01)
*H01L 23/52* (2006.01)
*H01L 29/40* (2006.01)

(52) U.S. Cl. ......... 257/783; 257/E21.238; 257/E21.599; 438/113; 438/459; 428/355 AC; 428/355 R; 522/95; 522/154

(58) Field of Classification Search ............ 438/33, 438/68, 113, 455, 458, 459, 460, 463, 464; 257/E21.238, 783, E21.599; 522/95, 154; 428/355 AC, 355 R; 156/307.1
See application file for complete search history.

(56) References Cited

U.S. PATENT DOCUMENTS

| 5,073,611 A | 12/1991 | Rehmer et al. |
| 5,270,431 A | 12/1993 | Blum |
| 7,767,556 B2 * | 8/2010 | Okawa ........................... 438/463 |
| 2002/0091173 A1 | 7/2002 | Hashimoto et al. |
| 2005/0031861 A1 | 2/2005 | Matsumura et al. |
| 2005/0139973 A1 * | 6/2005 | Matsumura et al. ......... 257/678 |
| 2006/0240246 A1 | 10/2006 | Fukuda et al. |
| 2007/0059903 A1 * | 3/2007 | Yano et al. .................... 438/459 |
| 2009/0017323 A1 | 1/2009 | Webb et al. |
| 2010/0233868 A1 | 9/2010 | Maeda et al. |
| 2011/0045290 A1 | 2/2011 | Maeda et al. |

FOREIGN PATENT DOCUMENTS

| JP | 64-040513 A | 2/1989 |
| JP | 02-305847 A | 12/1990 |
| JP | 4-110303 A | 4/1992 |
| JP | 05-335411 | 12/1993 |
| JP | 6-17008 A | 1/1994 |
| JP | 7-76672 A | 3/1995 |
| JP | 09-291264 A | 11/1997 |
| JP | 2000328023 A | 11/2000 |
| JP | 20000355678 A | 12/2000 |
| JP | 2002-187906 A | 7/2002 |
| JP | 2002212530 A | 7/2002 |
| JP | 2004331743 A | 11/2004 |
| JP | 2005292435 A * | 10/2005 |
| JP | 2008-28026 A | 2/2008 |

OTHER PUBLICATIONS

Patent Abstracts of Japan (Publication No. 04-110303) (Oct. 4, 1992), Ichinose Eiju, "Active Energy Ray-curable Resin Composition". (English Abstract).*
PCT App. No. PCT/JP2009/054742, International Preliminary Report on Patentability, dated Dec. 13, 2010.
English Abstract of JP 05-335411, (Dec. 17, 1993).
English Abstract of JP 2002-212530, (Jul. 31, 2002).
English Abstract of JP 2004-331743, (Nov. 25, 2004).
English Abstract of JP 2005-292435, (Oct. 20, 2005).
English Abstract of JP 09-291264, (Nov. 11, 1997).
English Abstract of JP 02-305847, (Dec. 19, 1990).
English Abstract of JP 20000355678, (Dec. 26, 2000).
English Abstract of JP 2000328023, (Nov. 28, 2000).
English Abstract of JP 64-040513, (Feb. 10, 1989).

* cited by examiner

*Primary Examiner* — Khiem D Nguyen
(74) *Attorney, Agent, or Firm* — Cahn & Samuels, LLP

(57) ABSTRACT

In a pressure-sensitive adhesive composition or a pressure-sensitive adhesive sheet containing an energy ray-curable polymer, problems associated with the volatilization of a low molecular weight compound contained in the composition are overcome. An energy ray-curable polymer characterized by comprising a radical generating group, which is capable of initiating a polymerization reaction upon excitation with an energy ray, and an energy ray-polymerizable group bonded together in the main or side chain.

10 Claims, No Drawings

ENERGY RAY-CURABLE POLYMER, AN ENERGY RAY-CURABLE ADHESIVE COMPOSITION, AN ADHESIVE SHEET AND A PROCESSING METHOD OF A SEMICONDUCTOR WAFER

This application is a U.S. national stage application of PCT/JP2009/054742 filed on Mar. 12, 2009 which claims priority of Japanese patent document 2008-093897 filed on Mar. 31, 2008 in Japan, the entireties of which are incorporated herein by reference.

TECHNICAL FIELD

The present invention relates to an energy ray-curable polymer, an adhesive composition and the adhesive sheet using thereof. Also, the present invention relates to the processing method of the semiconductor wafer, and in particular the present invention relates to a backside processing of the semiconductor wafer and the dicing processing of the semiconductor wafer.

BACKGROUND OF THE INVENTION

After a circuit is formed on the surface of the semiconductor wafer, a grinding processing is performed to the backside of the wafer, the backside grinding step which controls the thickness of the wafer and the dicing step which separate the wafer into predetermined chip size are carried out. Also, followed by the backside grinding step, the processing treatment which involves a heat generation such as an etching treatment is further performed to the backside.

During the etching of the backside grinding, the adhesive sheet so called backgrind tape is stuck to the circuit surface of the wafer in order to protect the circuit. Also, during the dicing of the wafer, the adhesive sheet so called a dicing tape is stuck to the backside of the wafer in order to prevent the scattering of the chips which are formed by dicing (hereinafter, such adhesive sheet in total may be described as "a semiconductor wafer processing adhesive sheet" or "a wafer processing adhesive sheet".

As for these wafer processing adhesive sheet, in particular as for the backgrind tape, it is required,
to prevent the damage to the circuit and the wafer body,
to have no residue of the adhesive agent (glue residue) of the adhesive agent on the circuit after the releasing,
to prevent the penetration of the grinding water to the circuit surface which washes out the grinding debris generated during the backside grinding and removes the heat generated during the grinding, and
to sufficiently maintain the precision of the wafer thickness after the grinding.

Further, when performing the processing treatment involving a generation of the heat or a heat application to the backside, it is required that the volatile component is not generated from the adhesive layer.

Also, as for the dicing tape, it is required,
to hold the wafer with a sufficient adhesive force during the dicing,
to release the chip easily from the dicing tape during the pickup of the chip,
to have no reside of the adhesive agent on the backside of the chip which is picked up, and
that the low molecular weight composition which is included in the adhesive layer does not flow out due to the dicing water during the dicing.

As for such wafer processing adhesive sheet, the adhesive sheet is widely used which is provided with the energy ray-curable adhesive layer, which cures by the energy ray such as ultraviolet ray, on the substrate consisting of the resin film. According to the adhesive sheet of the energy ray-curable type, during the backside grinding or dicing of the wafer, the wafer is held by strong adhesive force; therefore the grinding water is prevented from penetrating into the circuit surface and the chip is prevented from scattering. Also, after finishing the backside grinding or the dicing, the adhesive force is reduced since the adhesive layer cures by irradiating the energy ray thereto, hence the wafer (chip) is released from the adhesive sheet without the glue residue.

As for the energy ray-curable adhesive agent, the adhesive agent formed by blending the energy ray-curable resin having relatively low molecular weight and the photo polymerization initiator to the acrylic adhesive polymer, is well known. However, as for such adhesive agent, because it includes the low molecular weight substances each component is not necessarily mixed uniformly, and when the energy ray curing is carried out, an insufficient curing of the adhesive agent occurred in some cases, or the low molecular weight substances remained unreacted in some cases. Therefore, the adhesive agent remained on the wafer (chip) in some cases, or the wafer (chip) was contaminated by the low molecular weight substances in some cases.

In order to resolve such problems, the wafer processing adhesive sheet is proposed which comprises the energy ray-curable adhesive layer comprising the photo polymerization initiator and the energy ray-polymerizable adhesive polymer (hereinafter, it may be described as "polymerizable group adduct type adhesive agent") introducing the energy ray-polymerizable group in the molecule of the adhesive polymer by reacting the acrylic adhesive polymer to the compound including the energy ray-polymerizable group (Patent document 1). According to such polymerizable adduct type adhesive agent, the polymerizable group is uniformly dispersed in the adhesive layer, and the contamination due to the insufficient curing or the low molecular weight substances is reduced since the low molecular weight substances low.

Similarly, the polymer is proposed which binds the group forming the free radical which initiates the polymerization reaction under the excitation by the energy ray to the adhesive polymer (Patent document 2), or the polymer binding the photo polymerization initiator to the adhesive polymer is proposed (Patent document 3) in order to prevent the insufficient curing of the adhesive agent after the energy ray irradiation (hereinafter, these may be described as "radical generating group adduct type adhesive agent"). These radical generating group adduct type adhesive agent does not have polymerizing property by itself, therefore it is used together with the energy ray-curable resin having relatively low molecular weight substances as described in the above.

Patent document 1: JP-A-H09-298173
Patent document 2: JP-A-H08-333555
Patent document 3: JP-A-H09-111200

DISCLOSURE OF THE INVENTION

Technical Problems to be Solved by the Invention

As for the energy ray-curable adhesive agent using the polymerizable group adduct type adhesive agent described in the above, the photo polymerization initiator is blended together with the polymerizable group adduct type adhesive agent. Also, the radical generating group adduct type adhesive agent of the patent document 2 and 3 is used together with the energy ray-curable resin. Both the photo polymerization initiator and the energy ray-curable resin are compounds having relatively low molecular weight.

The energy ray-curable adhesive layer is obtained by diluting the above mentioned solvent followed by applying to the substrate or the release film then drying. However, in case the low molecular weight compound is included in the energy ray-curable adhesive agent, the low molecular weight compound volatilizes during the drying; hence the adhesive agent having the composition as designed couldn't be obtained in some cases.

For example, when using the photo polymerization initiator having low molecular weight, the photo polymerization initiator is volatilizing during the drying. If this happens excessively, then curing of the adhesive agent by the energy ray irradiation becomes insufficient; thereby there are problems that it causes the adhesive force after the curing to rise and also causes the glue residue against the adherend.

Also, when performing the wafer processing by using the wafer processing adhesive sheet, in case of performing the heat treatment to the semiconductor wafer or in case of carrying out the processing involving the heat application or heat generation as dry etching, the processing may be carried out under reduced pressure or in vacuo. Here, the low molecular weight compound remained in the adhesive layer after the curing volatilizes and causes similar problem as mentioned in above or it may contaminate the semiconductor apparatus due to the volatile gas component generated.

Furthermore, when using for the wafer processing, the water is sprayed in order to remove the heat and the cutting debris generated during the wafer backside grinding or the dicing. Here, the low molecular weight compound included in the adhesive layer may flow out.

Therefore, in regards with the energy ray-curable adhesive composition used in the wafer processing adhesive sheet, the present invention aims to solve the various problems accompanied with volatilization of the low molecular weight compound included in the composition.

Means for Solving the Problems

The objectives of the present invention aiming to solve such problems are as follows.

(1) An energy ray-curable polymer having a radical generating group capable of initiating polymerization reaction under the excitation by an energy ray, and an energy ray-polymerizable group bonded to a main chain or a side chain of the polymer.

(2) The energy ray-curable polymer as set forth in (1) wherein said radical generating group includes a phenyl carbonyl group which may comprise a substituent group in an aromatic ring.

(3) The energy ray-curable polymer as set forth in (1) or (2) wherein said radical generating group is derived from a monomer obtained by adding a compound comprising a polymerizable double bond to a hydroxyl group of a photo polymerization initiator comprising hydroxyl group.

(4) The energy ray-curable polymer as set forth in any one of (1) to (3) having a weight average molecular weight of 300,000 to 1,600,000.

(5) An energy ray-curable adhesive composition comprising the energy ray-curable polymer as set forth in any one of (1) to (4).

(6) An adhesive sheet comprising a substrate and an energy ray-curable adhesive layer formed thereon, and said energy ray-curable adhesive layer comprising the energy ray-curable adhesive composition as set forth in (5).

(7) The adhesive sheet as set forth in (6) used for a semiconductor wafer processing.

(8) A processing method of a semiconductor wafer comprising the step of adhering the energy ray-curable adhesive layer of the adhesive sheet as set forth in (7) to a circuit surface of the semiconductor wafer formed with the circuit on the front surface, and performing the backside processing of the wafer.

(9) The processing method of the semiconductor wafer as set forth in (8) wherein said backside processing of the semiconductor wafer is the backside grinding.

(10) The processing method of the semiconductor wafer comprising the step of adhering the energy ray-curable adhesive layer of the adhesive sheet as set forth in (7) to the backside of the semiconductor wafer formed with the circuit on the front surface, and performing the dicing of the wafer.

(11) The processing method of the semiconductor wafer as set forth in any one of (8) to (10) further comprising the step of applying or generating a heat.

EFFECT OF THE INVENTION

According to the present invention, in the adhesive sheet, the low molecular weight compound amount included in the adhesive agent before and after the curing by the energy ray is significantly reduced, hence the various problems such as the compositional changes along with the volatilization of the low molecular weight compound and the generation of the volatile gas or so can be solved. Furthermore, when using as for the semiconductor wafer processing, though the water is sprayed in order to remove the heat and the debris generated during the backside grinding and the dicing of the wafer, there is no composition change of the adhesive layer due to the flow out of the low molecular weight compound, since the amount of the low molecular weight compound included in the adhesive agent is significantly lowered.

BEST MODE FOR CARRYING OUT THE INVENTION

Hereinafter, the preferable embodiment of the present invention will be described in detail including the embodiment of the best mode.

The energy ray-curable polymer (A) of the present invention is the energy ray-curable polymer having the radical generation group capable of initiating the polymerization reaction under the excitation of the energy ray and the energy ray polymerization group bonded to the main chain or the side chain. As for the preferable embodiment, it is obtained by reacting the radical generating group containing polymer (a1) comprising the radical generating group containing monomer unit, the functional group containing monomer unit and other monomers depending on the needs, and the energy ray-polymerizing group containing compound (a2) comprising the substituent group reacting with said functional group.

[The Radical Generating Group Containing Monomer]

The radical generating group containing monomer used in the present invention becomes the monomer which derives the radical generating group of the energy ray-curable polymer of the present invention. Said monomer comprises the polymerizable double bond, and the group generating the free radical group (radical) which initiates the polymerization reaction under the excitation by the energy ray. As for the radical generating group, for example, the group including the phenyl carbonyl group which may comprise the substituent group in the aromatic ring; as shown in the following general formula.

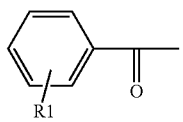

(R1 may be hydrogen atom or a carbohydrate group having carbon atoms of 1 to 12, and ether bond and hydroxyl group my be present with in R1)

Such radical generating group containing monomer is for example obtained by the addition reaction of the compound comprising the radical generating group and the compound comprising the polymerizable double bond.

As for the compound comprising the radical generating group, for example, photo polymerization initiator comprising the hydroxyl group may be mentioned. Specifically,

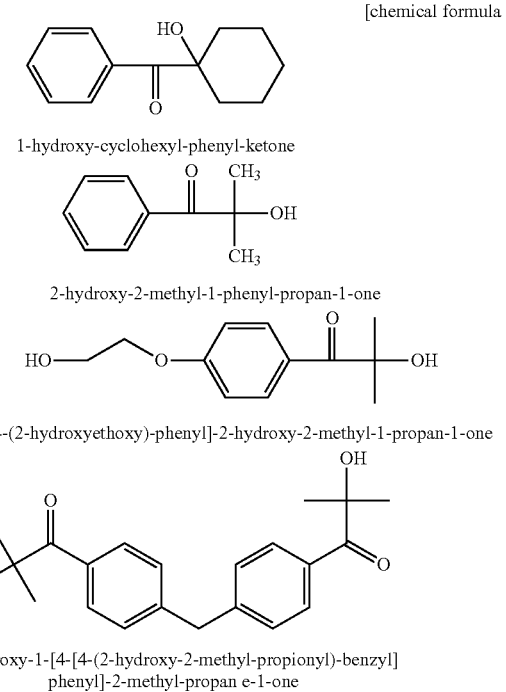

1-hydroxy-cyclohexyl-phenyl-ketone 2-hydroxy-2-methyl-1-phenyl-propan-1-one

1-[4-(2-hydroxyethoxy)-phenyl]-2-hydroxy-2-methyl-1-propan-1-one 2-hydroxy-1-[4-[4-(2-hydroxy-2-methyl-propionyl)-benzyl] phenyl]-2-methyl-propan e-1-one may be mentioned.

The monomer obtained by the addition reaction of such compound comprising the radical generating group and the compound comprising the polymerizable double bond, is preferable as the radical generating group containing monomer.

As for the compound comprising the polymerizable double bond, the compound comprising the polymerizble double bond having the functional group which react with the hydroxyl group is preferable; and for example, methacryloyloxyethyl isocyanate, meth-isopropenyl-a,a-dimethylbenzyl isocyanate, methacryloyl isocyanate, allyl isocyanate; glycidyl (meth)acrylate and; (meth)acrylic acid may be mentioned. Also, acryloyl monoisocyanate compound obtained by reacting a diisocyanate or polyisocyanate compound with hydroxyethyl (meth)acrylate; and acryloyl monoisocyanate compound obtained by reaction of diisocyanate or polyisocyanate compound, a polyol compounds and hydroxyethyl (meth)acrylate may be mentioned.

By reacting said compound comprising the hydroxyl group and the radical generating group, with said compound comprising the polymerizable double bond (for example, methacryloyloxyethyl isocyanate); the hydroxyl group of the compound comprising the radical generating group and the functional group (for example, isocyanate group) of the compound comprising the polymerizable double bond reacts; thereby the radical generating group containing monomer having the polymerizable double bond can be obtained.

As for the specific example of other monomers, o-acryloylbenzophenone, p-acryloylbenzophenone, o-methacryloylbenzophenone, p-methacryloylbenzophenone, p-(meth)acryloylethoxybenzophenone, monohydroxyalkylacrylate having 2 to 12 methylene groups derived from the benzophenone carbonic acid shown in the following general formula, or bezophenone carbonate ester of the monohydroxymethacrylate.

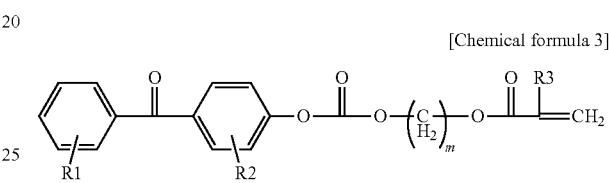

($R_1$ and $R_2$ may be hydrogen atom or alkyl group having 1 to 4 of carbon atoms respectively, $R_3$ may be hydrogen or a methyl group and m is an integer from 2 to 12), and compound in the following general formula,

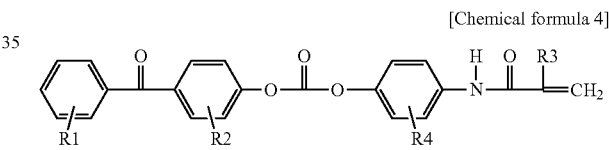

($R_1$ and $R_2$ may be hydrogen atom or alkyl group having 1 to 4 of carbon atoms respectively, and $R_3$ and $R_4$ includes hydrogen or methyl group respectively.) may be mentioned.

(The Radical Generating Group Containing Polymer (a1))

The radical generating group containing polymer (a1) is formed by polymerizing the radical generating group containing monomer, the functional group containing monomer for introducing the energy ray-polymerizable group, and other monomers if needed.

(The Functional Group Containing Monomer)

The functional group containing monomer constituting the radical generating group containing polymer (a1) is a monomer for introducing the energy ray-polymerizable group to the energy ray-curable polymer of the present invention. It is a monomer comprising the polymerizable double bond, and the functional group, such as the hydroxyl group, the carboxyl group, the amino group, the substituted amino group, the epoxy group or so in the molecule, and preferably an unsaturated compound containing the hydroxyl group or an unsaturated compound containing the carboxyl group are used.

As specific examples of such functional group containing monomer, an acrylate containing hydroxyl group such as 2-hydroxyethyl acrylate, 2-hydroxyethyl methacrylate, 2-hydroxypropyl acrylate, 2-hydroxypropyl methacrylate, 2-hydroxybutyl acrylate and 2-hydroxybutyl methacrylate; and compounds containing carboxyl group such as acrylic acid, methacrylic acid, and itaconic acid or so, may be mentioned. The above mentioned functional group containing monomer may be used alone or in combination of two or more thereof.
[Other Monomers]

Other monomers constituting the radical generating group containing polymer (a1) are not particularly limited, however, for example, as the polymer, an acrylic copolymer mainly using the acrylic monomer, and the olefin copolymer mainly using the olefin monomer may be mentioned. If the energy ray-curable polymer of the present invention is used as the adhesive agent, various acrylic copolymer which is relatively easy to control the adhesive force is preferable, and various acrylic monomer is used as the constitution unit.

As for the acrylic monomer, an (meth) acrylic acid alkyl ester having 1 to 18 carbon atoms of alkyl group is used. As the derivative of (meth) acrylic acid alkyl ester, methyl acrylate, methyl methacrylate, ethyl acrylate, ethyl methacrylate, propyl acrylate, propyl methacrylate, isopropyl acrylate, isopropyl methacrylate, n-butyl acrylate, n-butyl methacrylate, isobutyl acrylate, isobutyl methacrylate, n-hexyl methacrylate, 2-ethyl hexyl acrylate, 2-ethylhexyl methacrylate, cyclohexyl acrylate, lauryl methacrylate, dimethyl acrylamide or so may be mentioned.

Furthermore, a vinyl monomer copolymerizable with the above mentioned ester monomer may be copolymerized. As for the copolymerizable vinyl monomer, styrene, a-methyl styrene, vinyl toluene, vinyl formate, vinyl acetate, acrylonitrile, glycidyl acrylate, glycidyl methacrylate or so may be mentioned.

(The Formation of the Radical Generating Group Containing Polymer (a1))

The radical generating group containing polymer (a1) is formed by polymerizing the above mentioned radical generating group containing monomer, the functional group containing monomer, and other monomers if need.

The radical generating group containing polymer (a1) contains the structural units derived from the above radical generating group containing monomer usually in an ratio of 0.1 to 30 weight %, preferably 0.5 to 10 weight %, and more preferably 1 to 5 weight %. The radical generating group containing polymer (a1) contains the structural units derived from the above functional group containing monomer usually in an ratio of 1 to 70 weight %, preferably 5 to 40 weight %, and more preferably 10 to 30 weight %. The radical generating group containing polymer (a1) contains the structural units derived from above other monomers usually in an ratio of 0 to 99 weight %, preferably 35 to 90 weight %, and more preferably 50 to 80 weight %.

The radical generating group containing polymer (a1) is obtained by copolymerizing the above mentioned radical generating group containing monomer, the functional group containing monomer, and other monomers by a usual method; however, the production method of the radical generating group containing polymer (a1) is not particularly limited, and for example, it may be produced by using the solution polymerization under the presence of the solvent, the chain transfer agent, and the polymerization initiator or so; or by the aqueous emulsion polymerization under the presence of the emulsifier, the chain transfer agent, the polymerization initiator, and the dispersing agent, or so.

Note that, the monomer concentration during the polymerization is usually 30 to 70 weight %, preferably 40 to 60 weight % or so. As for the polymerization initiator used for the polymerization, a persulfate such as potassium persulfate, ammonium persulfate or so, an azo compound such as 2,2-'azobisisobutylonitrile, 2,2'-azobis(2,4-dimethylvaleronitrile) or so, called an peroxide such as hydrogen peroxide, benzoyl peroxide, lauryl peroxide or so, and a redox polymerization initiator comprising the combination of ammonium persulfate, with sodium sulfite or acid sodium sulfite or so may be mentioned. The amount of the polymerization initiator mentioned in the above is controlled within the range of 0.2 to 2 weight %, and preferably within the range of 0.3 to 1 weight % with respect to the whole amount of the monomer used in the polymerization.

Further, as for the chain transfer agent added during the copolymerization; alkyl mercaptans such as octyl mercaptan, nonyl mercaptan, decyl mercaptan, dodecyl mercaptan or so; thioglycolates such as octyl thioglycolate, nonyl thioglycolate, 2-ethyl hexyl thioglycolate, 2-ethyl hexyl β-mercaptopropionate or so; 2,4-diphenyl-4-methyl-1-pentene, 1-methyl-4-isopropylidine-1-cyclohexene or so may be mentioned. Particularly, when using the thioglycolates, 2,4-diphenyl-4-methyl-1-pentene, and 1-methyl-4-isopropylidine-1-cyclohexene, it is preferable since the obtained copolymer has low odor. Note that, the amount of chain transfer agent is controlled within the range of 0.001 to 3 weight % or so with respect to the whole monomer to be polymerized. Also, usually, the polymerization reaction is performed under 60 to 100° C. for 2 to 8 hours. Further, a viscosity improver, a wetting agent, a leveling agent, and an anti-foaming agent may be added accordingly.

[The Energy Ray-Curable Polymer (A)]

The energy ray-curable polymer (A) of the present invention is obtained by reacting the functional group derived from the functional group containing monomer of above mentioned radical generating group containing polymer (a1) with the energy ray-polymerizable group containing compound (a2).

[The Energy Ray-Polymerizable Group Containing Compound (a2)]

The energy ray-polymerizable group containing compound (a2) includes, the substituent group which can react with the functional group. This substituent group varies depending on the type of said functional group. For example, when the functional group is a hydroxyl or carboxyl group, the substituent group is preferably an isocyanate or epoxy group. When the functional group is a carboxyl group, then the substituent group is preferably an isocyanate or epoxy group. When the functional group is an amino or a substituted amino group, the substituent group is preferably an isocyanate or the like. When the functional group is epoxy group, the substituent group is preferred to be a carboxyl group. One substituent group is contained in every molecule of the energy ray-polymerizable group containing compound (a2).

Further, 1 to 5, and preferably 1 to 2 carbon-carbon double bond of the energy ray-polymerizable group, is contained in the energy ray-polymerizable group containing compound (a2). As specific examples of the energy ray-polymerizable group containing compound (a2); methacryloyloxyethyl isocyanate, meth-isopropenyl-a,a-dimethylbenzyl isocianate, methacryloyl isocyanate, allyl isocyanate, glycidyl (meth) acrylate and (meth) acrylic acid or so may be mentioned. Also, acryloyl monoisocyanate compound obtained by reaction of a diisocyanate or polyisocyanate compound with hydroxyethyl (meth)acrylate; acryloyl monoisocyanate compound obtained by reaction of a mixture of a diisocyanate or polyisocyanate compound, a polyol compound and hydroxyethyl (meth)acrylate may be mentioned as well.

As for the energy ray-polymerizable group containing compound (a2), an energy ray-polymerizable group containing polyalkyleneoxy compound, as described in the following, can be used as well.

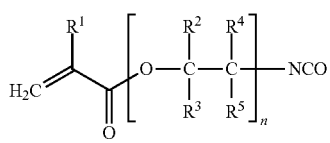

[Chemical formula 5]

In the above formula, R' is hydrogen atom or methyl group, and preferably methyl group. $R^2$ to $R^5$ are each independently hydrogen or alkyl group having 1 to 4 carbon atoms, and preferably hydrogen. Further, n is an integer of 2 or higher, and preferably 2 to 4. That is, since n is 2 or higher, in the above energy ray-polymerizable group containing polyalkyleneoxy compound includes 2 or more $R^2$. In here, $R^2$ which exists 2 or more, may be same or different from each other. This can be said to $R^3$ to $R^5$ as well. NCO in the chemical formula 5 indicates isocyanate group.

[Synthesis of the Energy Ray-Curable Polymer (A)]

The energy ray-curable polymer (A) of the present invention is obtained by reacting the radical generating group containing polymer (a1) and the energy ray-polymerizable group containing compound (a2) having a substituent group which reacts with the functional group of said radical generating group containing polymer (a1). Hereinafter, the production method of the energy ray-curable polymer (A) of the present invention will be described, particularly the example of using the acrylic copolymer as a main skeleton will be described. However, the energy ray-curable polymer (A) of the present invention is not limited to those obtained by the method of production described hereinafter.

When manufacturing the energy ray-curable polymer (A), the energy ray-polymerizable group containing compound (a2) is used in an amount of 100 to 5 equivalent amounts, preferably 70 to 10 equivalent amounts, and more preferably 40 to 15 equivalent amounts, per 100 equivalent amounts of the functional group containing monomer of the radical generating group containing polymer (a1).

The reaction between the radical generating group containing polymer (a1) and the energy ray-polymerizable group containing compound (a2) is usually performed at room temperature and at atmospheric pressure for 24 hours. It is preferable that this reaction is carried out in a solution, for example, an ethyl acetate solution in the presence of a catalyst such as dibutyltin laurate.

As a result, the functional group present in the side chain of the radical generating group containing polymer (a1) and the substituent group in the energy ray-polymerizable group containing compound (a2) reacts, and the energy ray-polymerizable group is introduced into the radical generating group (a1); thereby the acrylic energy ray-curable polymer (A) is obtained. In this reaction the reactivity between the functional group and the substituent group is usually 70% or more, preferably 80% or more, and it is preferable that the non reacting functional group does not remain in the energy ray-curable polymer (A).

When using the energy ray-polymerizable group containing polyalkyleneoxy compound, the acrylic energy ray-curable polymer (A) binding the energy ray-polymerizable group via the polyalkyleneoxy compound is obtained.

The weight average molecular weight of the energy ray-curable polymer (A) bonded with the energy ray-polymerizable group and the radical generating group is preferably 300,000 to 1,600,000, and further preferably 400,000 to 900,000. Also, usually $1\times10^{21}$ to $1\times10^{24}$, preferably $5\times10^{21}$ to $8\times10^{23}$, and more preferably $1\times10^{22}$ to $5\times10^{23}$ of polymerizable groups are contained per 100 g of the energy ray-curable polymer (A). Further, usually $1\times10^{20}$ to $1\times10^{24}$, preferably $2\times10^{20}$ to $5\times10^{23}$, and more preferably $5\times10^{20}$ to $2\times10^{23}$ of the radical generating groups are contained per 100 g of the energy ray-curable polymer (A).

[The Energy Ray-Curable Adhesive Composition]

The adhesive composition of the energy ray-curable type is obtained by blending the appropriate additives depending on the needs to the energy ray-curable polymer of the present invention.

As the additives, for example, the crosslinkers (B), tackifier, pigment, dye, filler or so may be mentioned; however, the adhesive composition may be the energy ray-curable polymer alone and without the blending thereof

[The Crosslinkers (B)]

As for the crosslinkers (B), for example, an organic polyvalent isocyanate compound, an organic polyvalent epoxy compound and an organic polyvalent imine compound or so may be mentioned.

As for the above mentioned organic polyvalent isocyanate compound, an aromatic polyvalent isocyanate compound, an aliphatic polyvalent isocyanate, and an alicyclic polyvalent isocyanate compound may be mentioned. As for further specific examples of the organic polyvalent isocyanate compound; 2,4-tolylene diisocyanate, 2,6-tolylene diisocyanate, 1,3-xylylene diisocyanate, 1,4-xylylene diisocyanate, diphenylmethane-4,4'-diisocyanate, diphenylmethane-2,4'-diisocyanate, 3-methyldiphenylmethane diisocyanate, hexamethylene diisocyanate, isophorone diisocyanate, dicyclohexylmethane-4,4'-diisocyanate, dicyclohexylmethane-2,4'-diisocyanate, and lysine isocyanate or so may be mentioned. A trimer of these polyvalent isocyanate compounds or an isocyanate terminated urethane prepolymer obtained by reacting these polyvalent isocyanate compounds with a polyol compound may be used as well.

As for specific examples of the above organic polyvalent epoxy compound, for example, a bisphenol A epoxy compound, a bisphenol F epoxy compound, 1,3-bis(N,N-diglycidylaminomethyl) benzene, 1,3-bis(N,N-diglycidylaminomethyl) toluene, N,N,N'N'-tetraglycidyl-4,4-diaminodiphenylmethane or so may be mentioned.

As specific examples of the above organic polyvalent imine compound, a N,N'-diphenylmethane-4,4'-bis(1-azridinecarboxyamide), trimethylolpropane-tri-β-aziridinyl propionate, tetramethylolmethane-tri-β-aziridinyl propionate N,N'-toluene-2,4-bis(1-aziridinecarboxyamindθ)triethylenemelamine or so may be mentioned.

[The Formation of the Energy Ray-Curable Adhesive Composition]

The used amount of above mentioned crosslinkers (B) is preferably 0.01 to 20 parts by weight and particularly preferably 0.1 to 10 parts by weight, with respect to 100 parts by weight of the energy ray-curable polymer (A).

As for the energy ray-curable adhesive composition formed as such, there is no need to further add the photo polymerization initiator or the low molecular weight compound such as the energy ray-polymerizable compound to the energy ray-curable polymer (A), since the energy ray-curable polymer (A) its self comprises the function as the photo polymerization initiator and the function as the energy ray polymerization compound. Therefore, according to the energy ray-curable adhesive composition of the present invention, the amount of the low molecular weight included in the adhesive composition is significantly reduced, thus can solve various problems such as the compositional change along with the volatilization of the low molecular weight, and the generation of the volatile gas or so.

However, the photo polymerization initiator, the energy ray-polymerizable low molecular weight compound, pigment, dye, filler or so may be included in said adhesive agent as far as it does not compromise the object of the present invention. Among these, the low molecular weight compound having a molecular weight of 1000 or less may be included at a ratio of 3 weight % or less in the adhesive agent.

[The Adhesive Sheet]

The adhesive sheet of the present invention is obtained by adhering the adhesive layer obtained from the adhesive composition of the present invention to the substrate. Also, depending on the needs, the release film may be used in order to protect the adhesive layer.

[The Substrate]

The substrate used in the adhesive sheet of the present invention is not particularly limited, and a polyethylene film, a polypropylene film, a polybutene film, a polybutadiene film, a polymethylpentene film, a polyvinyl chloride film, a vinyl chloride copolymer film, a polyethylene terephthalate film, a polybutylene terephthalate film, a polyurethane film, an ethylene/vinyl acetate copolymer film, an ionomer resin film, an ethylene/(meth)acrylic acid copolymer film, an ethylene/(meth) acrylic acid ester copolymer film, a polystyrene film, a polycarbonate film, a fluoro resin film, a low density polyethylene (LDPE) film, a linear low density polyethylene (LLDPE) film, or hydrogenated and modified film thereof may be used. Also, the crosslinking film thereof may be used as well. The above mentioned substrate may be alone, or it may be a composite film combining two or more thereof.

The thickness of the substrate varies depending on the use, however, it is usually 20 to 500 μm, and preferably 50 to 300 μam or so.

For example as described hereinafter, when the ultraviolet ray is used as the energy ray applied to cure the adhesive, among the above mentioned substrates, the one which is transparent to the ultraviolet ray is preferable. Also, when the electron beam is used as the energy ray, the substrates do not have to be transparent; hence addition to the films mentioned in the above, the opaque film by coloring them may be used.

[The Release Film]

As the release film, various films having the surface of a release property are used. As specific examples of such release film, a polyethylene film, a polypropylene film, a polybutene film, a polybutadiene film, a polymethylpentene film, a polyvinyl chloride film, a vinyl chloride copolymer film, a polyethylene terephthalate film, a polybutylene terephthalate film, a polyurethane film, an ethylene/vinyl acetate film, an ionomer resin film, an ethylene/(meth)acrylic acid copolymer film, an ethylene/(meth) acrylic acid ester copolymer film, a polystyrene film, a polycarbonate film, a fluorocarbon resin film, a low density polyethylene (LDPE) film, a linear low density polyethylene (LLDPE) film, and hydrogenated and modified substrate thereof may be used. Also, the crosslinking film thereof may be used as well. The above mentioned film may be alone, or it may be a composite film combining two or more thereof.

As the release film, the film in which the release treatment is performed on to the one of the surface of above mentioned film is preferable. A release agent used for the release treatment is not particularly limited; however, a silicone type, a fluorine type, an alkyd type, an unsaturated polyester type, a polyolefin type, a wax type or so may be used. Particularly, the silicone release agent is preferable since it can attain low releasing force. If the film used as the release film has weak surface tension by itself, and has low releasing force to the adhesive layer, such as the polyolefin film, then there is no need for the release treatment.

As the method of the release treatment, the release agent is coated using a gravure coater, a meyer-bar coater, an air knife coater, or a roll coater or so to said film without the solvent, or by solvent diluting or emulsifying. Then, the release agent is heated, or irradiated with the ultraviolet ray or the electron beam for curing, thereby the release layer is formed.

The thickness of the above release film is preferably 12 μm or thicker, more preferably 15 to 1000 μm, and particularly preferably 50 to 200 μm. When the release film is too thin, the dimensional stability of the adhesive sheet itself becomes insufficient, against the stress accumulating during the steps of stacking each layer constituting the adhesive sheet and the step of winding the adhesive sheet. If the release layer is too thick, the whole thickness of the adhesive sheet becomes too thick, hence it becomes difficult to handle.

[The Manufacturing of the Adhesive Sheet]

The adhesive sheet of the present invention comprises the above mentioned energy ray-curable adhesive composition and the substrate. The adhesive sheet of the present invention is obtained by coating the energy ray-curable adhesive agent with the appropriate thickness on various substrates in accordance with the generally known methods such as a roll knife coater, a comma coater, a gravure coater, a die coater, a reverse coater or so; then the adhesive layer is formed by drying, followed by superimposing the release film on the adhesive layer depending on the needs. Also, the adhesive sheet may be manufactured by providing the adhesive layer on the release film and transferring these onto said substrate.

The thickness of the adhesive layer varies depending on the use; however it is usually 5 to 100 μm, and preferably 10 to 40 μm or so. If the adhesive layer becomes thin, the adhesive property and the surface protection function may decline.

The adhesive sheet of the present invention can lower the adhesive force by the energy ray irradiation, and as for the energy ray, specifically the ultraviolet ray and the electron beam or so are used. Also the irradiation amount varies depending on the type of the energy ray, and for example when using the ultraviolet ray, the ultraviolet ray intensity is 50 to 300 mW/cm$^2$ or so, and the ultraviolet ray irradiation amount is preferably 100 to 1200 mJ/cm$^2$ or so.

The energy ray-curable adhesive layer used in the present invention has sufficient adhesive force before the energy ray irradiation; hence the semiconductor wafer can be securely held during the semiconductor wafer processing step such as backside grinding and dicing or so.

Said energy ray-curable adhesive layer cures by the energy ray irradiation and the adhesive force significantly declines. For example, the adhesive force against the mirror surface of the semiconductor wafer is preferably 2000 to 15000 mN/25 mm and further preferably 5000 to 10000 mN/25 mm or so before the energy ray irradiation, on the other hand after the irradiation, it is 1 to 50% or so of that of before the irradiation.

[The Processing Method of the Semiconductor Wafer]

The adhesive sheet of the present invention can be used for processing the semiconductor wafer as described in the following.

(The Wafer Backside Grinding Method)

During the backside grinding of the wafer, the wafer processing adhesive sheet is stuck to the circuit face of the semiconductor wafer formed with the circuit on the front surface in order to protect the circuit surface while the backside grinding of the wafer and to have a predetermined thickness of the wafer.

The semiconductor wafer can be a silicon wafer, or a compound semiconductor wafer such as gallium arsenide. The formation of the circuit on the wafer surface can be performed by conventionally widely used various methods such as an etching method and a lift off method or so. The predetermined circuit is formed during the circuit forming step of the semiconductor wafer. The thickness of such wafer at before the grinding is not particularly limited; however it is usually 500 to 1000 μm or so.

Then, during the backside grinding, the adhesive sheet of the present invention is stuck to the circuit surface in order to protect the circuit surface. The backside grinding is performed by known methods using the grinder and the vacuum table or so for fixing the wafer while the adhesive sheet is stuck. After the backside grinding step, the treatment to remove the fractured layer due to the grinding may be performed.

After the backside grinding step, the energy ray is irradiated to the adhesive sheet to cure the adhesive agent for reducing the adhesive force, then the adhesive sheet is released from the circuit surface. The adhesive sheet of the present invention has sufficient adhesive force before the energy ray irradiation; hence the wafer is securely held during the backside grinding of the wafer, and also can prevent the penetration of the grinding water into the circuit surface. Also, the adhesive force declines significantly after the adhesive agent is cured by the energy ray irradiation; hence it can be easily released from the circuit surface and the glue residue to the circuit surface can be reduced.

Further, according to the energy ray-curable adhesive agent of the present invention, the amount of the low molecular weight compound included in the adhesive agent is significantly lowered; hence there is no flow out of the low molecular weight due to the grinding water.

(The Wafer Backside Processing Method)

Also, followed by said backside grinding step, various processing are performed to the backside of the wafer.

For example, in order to further form the circuit pattern to the backside of the wafer, the treatment involving the heat generation such as an etching treatment or so may be performed. Also, the die bond film may be heat pressed to the backside of the wafer. During these steps, the circuit pattern can also be protected by adhering the adhesive sheet of the present invention; and, it will be exposed to a high temperature condition. However, since the low molecular weight compounds is not substantially included in the adhesive layer of the adhesive sheet of the present invention, the volatilization of the low molecular weight compounds by heat generation and heat application during the processing can be suppressed.

(The Wafer Dicing Method)

The adhesive sheet of the present invention has the property which significantly reduces the adhesive force by the energy ray irradiation, hence it may be used as the dicing sheet.

When using as the dicing sheet, the adhesive sheet of the present invention is stuck to the backside of the wafer. The dicing sheet is stuck generally by the apparatus called a mounter, however it is not particularly limited.

The dicing method of the semiconductor wafer is not particularly limited. As for an example, the method of forming chips from a wafer by known methods such as a method using a rotating round blade of a dicer or so after fixing the peripheral portion of the dicing tape by the ring flame when dicing the wafer may be mentioned. Alternatively, it may be a dicing method using a laser light. According to the adhesive sheet of the present invention, the amount of the low molecular weight compounds included in the adhesive layer can be significantly reduced; hence the low molecular weight compounds does not flow out due to the grinding water.

Next, the energy ray is irradiated to the adhesive sheet and the adhesive agent is cured to reduce the adhesive force, then the chips are picked up from the adhesive sheet. The chips picked up are then die bonded by usual method and resin sealed thereby the semiconductor apparatus is manufactured. According to the adhesive sheet of the present invention, the glue residue and the contamination due to the low molecular weight compound to the backside of the chips are reduced; hence no adverse effect due to the residue of the chip backside occurs.

Hereinabove, the energy ray-curable polymer of the present invention, particularly when using as the main component of the adhesive layer in the wafer processing adhesive sheet was explained as an example, however the energy ray-curable polymer of the present invention may be used besides the above mentioned, and for example it may be used as the molding resin, adhesive bond, paint and ink or so which has a adverse effect due to the volatilization component.

EXAMPLE

Hereinafter the present invention will be described based on the examples; however the present invention is not limited thereto.

Example 1

Synthesis of the Radical Generating Group Containing Monomer)

The radical generating group containing monomer was obtained by mixing and reacting, 1-[4-(2-hydroxyethoxy)-phenyl]-2-hydroxy-2-methyl-1-propan-1-one (made by Ciba speciality chemical Inc., product name "IRGACURE 2959") and methacryloyloxyethyl isocyanate at the same molar ratio.

Synthesis of the Radical Generating Group Containing Polymer

The acrylic radical generating group containing polymer was synthesized by a solution polymerization in ethyl acetate solution using; 57 parts by weight of butyl acrylate, 10 parts by weight of methylmethacrylate, 28 parts by weight of 2-hydroxyethylacrylate as the functional group containing monomer, and 5 parts by weight of the radical generating group containing polymerizable monomer formed in the above. 2,2-'azobisisobutylonitrile was used as the polymerization initiator, and 2,4-diphenyl-4-methyl-1-pentene was used as the chain transfer agent. (Hereinafter, if not particularly mentioned, the above mentioned polymerization initiator and the chain transfer agent during the synthesis of the radical generating group containing polymerizable copolymer are used).

(Formation of the Energy Ray-Curable Polymer)

100 parts by weight, in terms of the solid portion, of this acrylic radical generating group containing polymer and 30 parts by weight of methacryloyloxyethyl isocyanate (80 equivalent amounts with respect to 100 equivalent amounts of the hydroxyl group as a functional group of the acrylic radical generating group containing polymer) were reacted and obtained ethyl acetate solution (30% solution) of the acrylic energy ray-curable polymer having weight average molecular weight of 630,000 formed by bonding the polymerization group and radical generating group.

(Formation of the Energy Ray-Curable Adhesive Composition)

With respect to 100 parts by weight of this acrylic energy ray-curable polymer, 0.625 parts (solid portion) by weight of the polyvalent isocyanate compound (made by Nippon Polyurethance Co., product name "Coronate L") were mixed to obtain the acrylic energy ray-curable adhesive composition.
(Formation of the Adhesive Sheet)

The above mentioned adhesive composition was coated, so that the thickness of the coat is 40 μm after the drying, by using the roll knife coater to the surface of the polyethylene telephtalate film (thickness of 38 μm) which is silicone release treated as the release sheet. Next, after drying at 100° C. and 120° C. for 2 minutes, then polyethylene film having thickness of 110 μm as the substrate was stacked to the obtained adhesive layer, thereby the adhesive sheet was obtained. In order to stabilize the adhesive force, it was left under the atmosphere of 23° C. 50% RH for 7 days, and then the following physical property and the ability were evaluated.

"The adhesive force"

The adhesive force of the obtained adhesive sheet was measured as follows.

The adhesive force of the adhesive sheet was measured by using Universal Testing Instruments (TENSILON/UTM-4-100, made by ORIENTEC CO., LTD) at the releasing speed of 300 mm/min, and releasing angle of 180° following JIS Z0237, besides the mirror surface of the silicon wafer was the adherend, and the adhesive force before curing was determined.

Also, after the adhesive sheet was stuck to the mirror surface of the silicon wafer, it was left under the atmosphere of 23° C. 50% RH for 20 minutes, and the ultraviolet ray irradiation was performed (irradiation condition: intensity 350 mW/cm$^2$, amount of light 200 mJ/cm$^2$) from the substrate side of the adhesive sheet by using the ultraviolet irradiation apparatus (made by LINTEC Corporation, product name "RAD-2000"). The adhesive force was measured as similar as the above in regards with the adhesive sheet after the ultraviolet ray irradiation, and the adhesive force after the energy ray irradiation was determined.

"The Surface Contamination Property"

The surface contamination property when using the above mentioned adhesive sheet as the surface protection sheet during the backside grinding of the semiconductor wafer was evaluated as the following.

The above mentioned adhesive sheet was stuck to the patterned surface of the silicon dummy wafer (thickness: 725 μm, surface status: comprises the circuit pattern having 20 μm step difference at maximum), by using the tape laminator (made by LINTEC Corporation, product name "RAD-3510"). Then, by using the wafer backside grinding apparatus (made by Disco Corporation, product name "DGP-8760"), the wafer thickness was ground till it becomes 100 μm thick. Next, the ultraviolet ray irradiation was performed (irradiation condition: intensity 350 mW/cm$^2$, amount of light 200 mJ/cm$^2$) by using the ultraviolet irradiation apparatus (made by LINTEC Corporation, product name "RAD-2000") from the substrate of the adhesive sheet. Next, by using the tape mounter (made by LINTEC Corporation, product name "RAD-2000F/12"), the dicing tape (made by LINTEC Corporation, product name "D-185") was stuck to the grinding surface, then said adhesive sheet was released from the circuit surface.

Next, the circuit surface of the silicon dummy wafer was observed using the digital microscope (made by KEYENCE CORPORATION, product name "Digital microscope VHX-200") at 2000 magnification. When the adhesive residual was not found, the surface contamination property was evaluated "good", and when the residual was found, the surface contamination property was evaluated "bad".

"The Weight Reduction Rate (the Volatile Gas Amount) after Heating"

The weight reduction rate after heating was evaluated by measuring the weight reduction using the differential thermal•thermalgravity simultaneous instrument (made by SHIMADZU CORPORATION, product name "DTG-60"). A piece of the above mentioned adhesive sheet (0.01 g; release film was removed) was raised up to 120° C. at 10° C./min, followed by heating at 120° C. for 60 minutes, then returned to room temperature and determined the weight reduction rate of before and after the heating.

Example 2

The acrylic radical generating group containing polymer was synthesized by solution polymerizing in ethyl acetate solution, using 68.2 parts by weight of butyl acrylate, 10 parts by weight of dimethyl methacrylate, 16.8 parts by weight of 2-hydroxyethylacrylate, and 5 parts by weight of the radical generating group containing monomer prepared in the example 1. 100 parts by weight, in terms of the solid portion, of this radical generating group containing polymer and 18.7 parts by weight methacryloyloxyethyl isocyanate (83.3 equivalent amount with respect to 100 equivalent amount hydroxyl group as a functional group of the acrylic radical generating group containing polymer) were reacted, and obtained ethyl acetate solution (30% solution) of the energy ray-curable polymer having a weight average molecular weight of 680,000 formed by bonding the polymerization group and radical generating group.

With respect to 100 parts by weight of this energy ray-curable polymer, 0.625 parts by weight (solid portion) of the polyvalent isocyanate compound (made by Nippon Polyurethance Co., product name "Coronate L") were mixed to obtain the energy ray-curable adhesive composition.

The same procedures were performed as the example 1 except for forming the adhesive layer by using the above mentioned adhesive composition. The results are shown in Table 1.

Example 3

The acrylic radical generating group containing polymer was synthesized by solution polymerizing in ethyl acetate solution, using 68.2 parts by weight of butyl acrylate, 10 parts by weight of methyl methacrylate, 16.8 parts by weight of 2-hydroxyethylacrylate, and 5 parts by weight of the radical generating group containing monomer prepared in the example 1. 100 parts by weight, in terms of the solid portion, of this radical generating group containing polymer and 18.7 parts by weight methacryloyloxyethyl isocyanate (83.3 equivalent amount with respect to 100 equivalent amount hydroxyl group as a functional group of the acrylic radical generating group containing polymer) were reacted, and obtained ethyl acetate solution (30% solution) of the energy ray-curable polymer having a weight average molecular weight of 680,000 formed by bonding the polymerization group and radical generating group.

The acrylic copolymer was synthesized by solution polymerizing in ethyl acetate solution using, 73.2 parts by weight of butyl acrylate, 10 parts by weight of methyl methacrylate, and 16.8 parts by weight of 2-hydroxyethylacrylate. 100 parts by weight, in terms of the solid portion, of this acrylic copolymer and 18.7 parts by weight of methacryloyloxyethyl isocyanate (83.3 equivalent amount with respect to 100 equivalent amount hydroxyl group as a functional group of the acrylic copolymer) were reacted, and obtained ethyl acetate solution (30% solution) of the acrylic adhesive polymer having weight average molecular weight of 600,000 formed by bonding the polymerization group via the alkylene oxide group.

With respect to 100 parts by weight of this energy ray-curable polymer, 0.625 parts by weight (solid portion) of the polyvalent isocyanate compound (made by Nippon Polyurethance Co., product name "Coronate L") were mixed to obtain the energy ray-curable adhesive composition.

The same procedures were performed as the example 1 except for forming the adhesive layer by using the above mentioned adhesive composition. The results are shown in Table 1.

Comparative Example 1

Formation of the Adhesive Composition

The acrylic copolymer was synthesized by solution polymerizing in ethyl acetate solution using, 62 parts by weight of butyl acrylate, 10 parts by weight of methyl methacrylate, and 28 parts by weight of 2-hydroxyethylacrylate. 100 parts by weight, in terms of the solid portion, of this acrylic copolymer and 30 parts by weight of methacryloyloxyethyl isocyanate (80 equivalent amount with respect to 100 equivalent amount hydroxyl group as a functional group of the acrylic copolymer) were reacted, and obtained ethyl acetate solution (30% solution) of the acrylic copolymer having weight average molecular weight of 600,000 formed by bonding the polymerizable group via an alkylene oxide group.

With respect to 100 parts by weight of this acrylic copolymer, 0.625 parts by weight (solid portion) of the polyvalent isocyanate compound (made by Nippon Polyurethance Co., product name Coronate L), and 3.3 parts by weight (solid portion) of the photopolymerization initiator (made by Ciba speciality chemical Inc., product name IRGACURE 184) were mixed and obtained the adhesive composition.

The same procedures were performed as the example 2 except for forming the adhesive layer by using the above mentioned adhesive composition. The results are shown in Table 1.

Comparative Example 2

The acrylic copolymer was synthesized by solution polymerizing in ethyl acetate solution using, 73.2 parts by weight of butyl acrylate, 10 parts by weight of dimethyl methacrylate, and 16.8 parts by weight of 2-hydroxyethylacrylate. 100 parts by weight, in terms of the solid portion, of this acrylic copolymer and 18.7 parts by weight of methacryloyloxyethyl isocyanate (83.3 equivalent amount with respect to 100 equivalent amount hydroxyl group as a functional group of the acrylic copolymer) were reacted, and obtained ethyl acetate solution (30% solution) of the acrylic adhesive polymer having weight average molecular weight of 600,000 formed by bonding the polymerization group via the alkylene oxide group.

With respect to 100 parts by weight of this acrylic adhesive polymer, 0.625 parts by weight (solid portion) of the polyvalent isocyanate compound (made by Nippon Polyurethance Co., product name Coronate L), and 3.3 parts by weight (solid portion) of the photopolymerization initiator (made by Ciba speciality chemical Inc., product name IRGACURE 184) were mixed and obtained the adhesive composition.

The same procedures were performed as the example 2 except for forming the adhesive layer by using the above mentioned adhesive composition. The results are shown in Table 1.

Comparative Example 3

The acrylic copolymer having weight average molecular weight of 600,000 was synthesized by solution polymerizing in ethyl acetate solution using, 73.2 parts by weight of butyl acrylate, 10 parts by weight of methyl methacrylate, and 16.8 parts by weight of 2-hydroxyethylacrylate. 100 parts by weight, in terms of the solid portion, of this acrylic copolymer and 18.7 parts by weight of methacryloyloxyethyl isocyanate (83.3 equivalent amount with respect to 100 equivalent amount hydroxyl group as a functional group of the acrylic copolymer) were reacted, and obtained ethyl acetate solution (30% solution) of the acrylic adhesive polymer formed by bonding the polymerization group via the alkylene oxide group.

With respect to 100 parts by weight of this acrylic adhesive polymer, 0.625 parts by weight (solid portion) of the polyvalent isocyanate compound (made by Nippon Polyurethance Co., product name Coronate L), and 3.3 parts by weight (solid portion) of the photopolymerization initiator (made by Ciba speciality chemical Inc., product name IRGACURE 184) were mixed and obtained the adhesive composition.

The same procedures were performed as the example 2 except for forming the adhesive layer by using the above mentioned adhesive composition. The results are shown in Table 1.

TABLE 1

| | Adhesive force mN/25 mm) | | | | Surface Contamination Property | | The weight reduction rate after heating (The out gas amount) (%) | |
|---|---|---|---|---|---|---|---|---|
| | Adhesive Layer 100° C. during the drying | | Adhesive Layer 120° C. during the drying | | 100° C. during | 120° C. during | 100° C. during | 120° C. during |
| | Before curing | After curing | Before curing | After curing | the drying | the drying | the drying | the drying |
| Example 1 | 9300 | 230 | 9000 | 240 | Good | Good | −1.09 | −1.10 |
| Example 2 | 12000 | 280 | 11500 | 290 | Good | Good | −1.04 | −1.03 |
| Example 3 | 8000 | 400 | 8300 | 420 | Good | Good | −1.06 | −1.06 |
| Comparative example 1 | 9200 | 280 | 9900 | 800 | Good | Bad | −5.15 | −4.21 |

TABLE 1-continued

|  | Adhesive force mN/25 mm) | | | | Surface Contamination Property | | The weight reduction rate after heating (The out gas amount) (%) | |
| --- | --- | --- | --- | --- | --- | --- | --- | --- |
|  | Adhesive Layer | | Adhesive Layer | | | | | |
|  | 100° C. during the drying | | 120° C. during the drying | | 100° C. during | 120° C. during | 100° C. during | 120° C. during |
|  | Before curing | After curing | Before curing | After curing | the drying | the drying | the drying | the drying |
| Comparative example 2 | 13100 | 320 | 12300 | 950 | Good | Bad | −5.21 | −4.32 |
| Comparative example 3 | 12100 | 350 | 11000 | 1150 | Good | Bad | −5.18 | −4.23 |

The invention claimed is:

1. An energy ray-curable polymer, comprising:
   a radical generating group capable of initiating polymerization reaction under the excitation by an energy ray, and
   an energy ray-polymerizable group bonded to a main chain or a side chain of the polymer,
   wherein said radical generating group is derived from a monomer obtained by adding a compound comprising a polymerizable double bond to a hydroxyl group of a photo polymerization initiator.

2. The energy ray-curable polymer as set forth in claim 1 wherein said radical generating group includes a phenyl carbonyl group which may comprise a substituent group in an aromatic ring.

3. The energy ray-curable polymer as set forth claim 1 having a weight average molecular weight of 300,000 to 1,600,000.

4. An energy ray-curable adhesive composition comprising the energy ray-curable polymer as set forth in claim 3.

5. An adhesive sheet comprising a substrate and an energy ray-curable adhesive layer formed thereon, and said energy ray-curable adhesive layer comprising the energy ray-curable adhesive composition as set forth in claim 4.

6. The adhesive sheet as set forth in claim 5 used for a semiconductor wafer processing.

7. A processing method of a semiconductor wafer comprising the step of adhering the energy ray-curable adhesive layer of the adhesive sheet as set forth in claim 6 to a circuit surface of the semiconductor wafer formed with the circuit on the front surface, and performing the backside processing of the wafer.

8. The processing method of the semiconductor wafer as set forth in claim 7 wherein said backside processing of the semiconductor wafer is the backside grinding.

9. The processing method of the semiconductor wafer comprising the step of adhering the energy ray-curable adhesive layer of the adhesive sheet as set forth in claim 6 to the backside of the semiconductor wafer formed with the circuit on the front surface, and performing dicing of the wafer.

10. The processing method of the semiconductor wafer as set forth in claim 9 further comprising the step involving a heat application or a heat generation.

* * * * *